United States Patent [19]
McKenny

[11] Patent Number: 5,995,421
[45] Date of Patent: Nov. 30, 1999

[54] CIRCUIT AND METHOD FOR READING A MEMORY CELL

[75] Inventor: Vernon George McKenny, Cuchara, Colo.

[73] Assignee: STMicroelectronics, Inc., Carrollton, Tex.

[21] Appl. No.: 09/087,399

[22] Filed: May 29, 1998

[51] Int. Cl.[6] .............................. G11C 7/00; G11C 16/06
[52] U.S. Cl. ................. 365/189.07; 365/210; 365/185.2; 365/185.21; 365/205
[58] Field of Search ........................... 365/189.07, 185.2, 365/185.21, 210, 205

[56] References Cited

U.S. PATENT DOCUMENTS

| | | |
|---|---|---|
| 3,969,706 | 7/1976 | Proebsting et al. ................. 340/173 R |
| 5,594,691 | 1/1997 | Bashir ............................. 365/189.07 X |
| 5,729,492 | 3/1998 | Campardo ......................... 365/185.21 |

*Primary Examiner*—Huan Hoang
*Attorney, Agent, or Firm*—David V. Carlson; Theodore E. Galanthay; Lisa K. Jorgenson

[57] ABSTRACT

A read circuit reads data stored in a memory cell that is coupled to a bit line. The read circuit includes a comparison circuit, such as a sense amplifier, having a first input terminal coupled to the bit line and having a second input terminal and a data output terminal. A switch is coupled between the bit line and the second input terminal of the comparison circuit and includes a control terminal that is coupled to receive a control signal.

15 Claims, 6 Drawing Sheets

5,995,421

CIRCUIT AND METHOD FOR READING A MEMORY CELL

TECHNICAL FIELD

The invention relates generally to integrated circuits, and more specifically to a circuit and method for reading a memory cell such as a nonvolatile memory cell.

BACKGROUND OF THE INVENTION

Many memory manufacturers are trying to develop nonvolatile memory circuits that are both small enough and fast enough to replace traditional nonvolatile storage media such as magnetic hard drives. Such nonvolatile memory circuits include flash erasable and programmable read-only memory (flash-EPROM) and flash electrically erasable and programmable read-only memory (flash-EEPROM).

Unfortunately, many flash memories have relatively slow write speeds and relatively small storage capacities because they must precisely erase their memory cells to avoid offset currents, which, if high enough, can corrupt data during a read cycle. Because the erase routine is relatively long and must be done before each program cycle, it increases the write time, and thus reduces the write speed, of a flash memory.

FIG. 1 is a schematic diagram of a read circuit that increases the write speed of a flash memory by eliminating the need for the lengthy erase procedure. Specifically, a read circuit 10 compensates for offset currents generated in a bit line 12 by memory cells 14, only one of which is shown in FIG. 1 for clarity. If an offset current is flowing in the bit line 12, it will cause an offset-voltage drop across a load transistor 16. Therefore, before a memory cell 14 is activated for reading, i.e., before a word line WL coupled to the cell 14 is driven active high, a control signal activates a transistor 18 so that an offset current flowing in the bit line 12 will cause a current to flow through the transistor 18 and charge a capacitor 20 to the offset voltage generated across the load 16. After the capacitor 20 charges to the offset voltage, the transistor 18 is deactivated. Because the input terminals of a comparator 22 are high impedance, the capacitor 20 holds its charge. Next, WL is driven high to activate both the memory cell 14, which generates a read current through the load 16, and a reference cell 24, which generates a reference current through a load 26. Thus, the read current generates a read voltage at a node 27, and the reference current generates a reference voltage at a node 28. The voltage drop at the node 27 caused by the offset current through the load 16, however, is canceled by the offset voltage stored on the capacitor 20. Therefore, the comparator 22 compares the true read voltage (the read voltage without any offset component) with the reference voltage to generate a data signal. Thus, by compensating for offset currents generated by the memory cells 14, the circuit 10 prevents read errors without requiring that all of the cells 14 be precisely erased to eliminate such offset currents.

Still referring to FIG. 1, a transistor 29 and capacitor 30 can compensate for an offset current drawn by the reference cell 24. But even if the cell 24 does not draw an offset current, the transistor 28 and capacitor 30 can be included to balance the impedances at the input terminals of the comparator 22. A circuit similar to the read circuit 10 is discussed in U.S. Pat. No. 5,729,492 to Campardo, which is incorporated by reference.

A problem with the circuit 10, however, is that the capacitors 20 and 30 may be relatively bulky and thus occupy a relatively large die area, or may increase the complexity of the manufacturing process. Furthermore, the reference cell or cells 24 also occupy a significant die area and often must be calibrated by performing a lengthy and complex procedure during testing of the circuit 10.

SUMMARY OF THE INVENTION

In accordance with an aspect of the invention, a read circuit is provided for reading data stored in a memory cell that is coupled to a bit line. The read circuit includes a comparison circuit having a first input terminal coupled to the bit line and having a second input terminal and a data output terminal. The read circuit also includes a switch that is coupled between the bit line and the second input terminal of the comparison circuit and that has a control terminal coupled to receive a control signal.

Thus, such a read circuit does not require coupling capacitors or a reference memory cell or cells as does the circuit 10 of FIG. 1.

BRIEF DESCRIPTION OF HE DRAWINGS

DETAILED DESCRIPTION OF THE INVENTION

Figure 1:
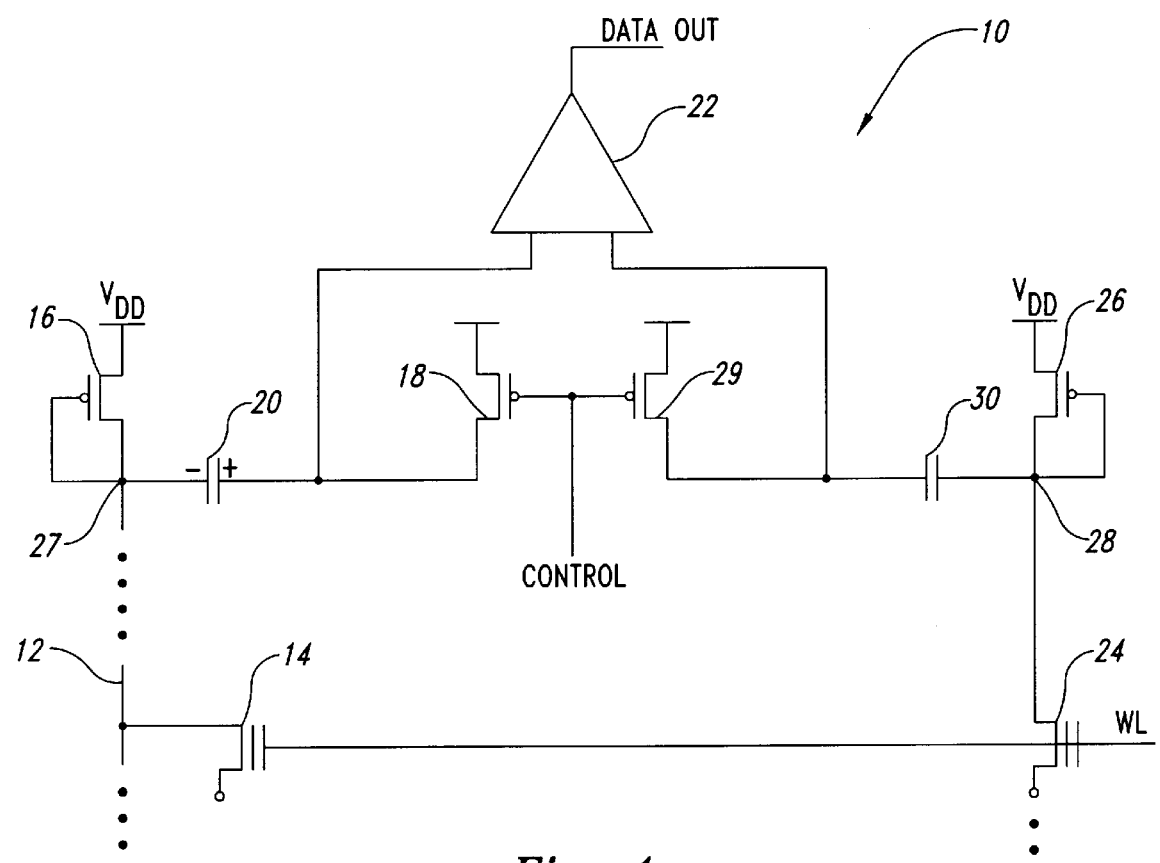
FIG. 1 is a schematic diagram of a memory-cell read circuit according to the prior art.
Figure 2:
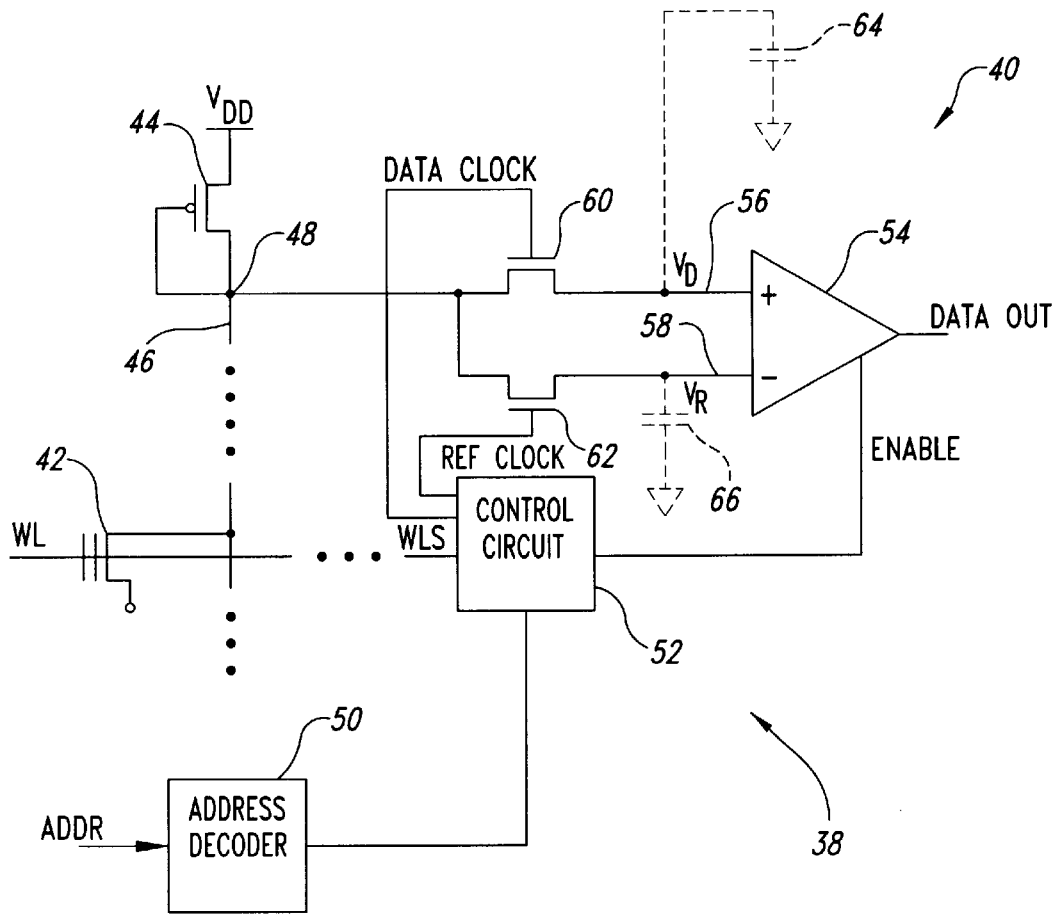
FIG. 2 is a schematic diagram of a memory circuit that includes an embodiment of a memory-cell read circuit according to the invention.

FIG. 2 is a schematic diagram of a memory circuit 38, which includes a read circuit 40 according to an embodiment of the invention. The memory circuit 38 includes nonvolatile memory cells 42, word lines WL that control the cells 42, a load 44 for converting a current on a bit line 46 to a voltage at a node 48, and an address decoder 50 for selecting addressed ones of the memory cells 42. The memory circuit 38 also includes a control circuit 52, which generates word-line signals WLS on the word lines WL and otherwise controls the operation of the memory circuit 38 and the read circuit 40 as described below. Although shown as a single circuit, in other embodiments the control circuit 52 may be composed of multiple circuits that each perform one or more control functions. Furthermore, for clarity, only one cell 42 and word line WL are shown. Additionally, the circuit 38 may include more loads 44 and bit lines 46.

The read circuit 40 includes a comparison circuit 54, such as a sense amplifier, which has both of its input terminals 56 and 58 coupled to the node 48 via a data switch 60 and a reference switch 62, respectively. As discussed below, the circuit 54 is unbalanced in favor of the input terminal 56. The input terminals 56 and 58 have associated therewith parasitic capacitors 64 and 66, respectively, and in one embodiment, the data and reference switches 60 and 62 are NMOS transistors. The control circuit 52 generates a Data Clock signal that controls the data switch 60, a Reference Clock signal that controls the reference switch 62, and an Enable signal that controls the comparison circuit 54.

Figure 3:
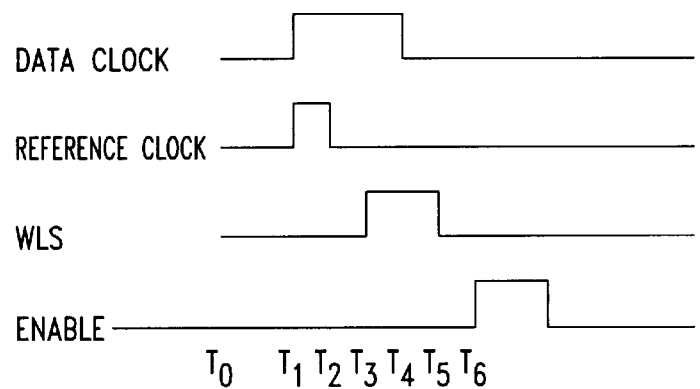
FIG. 3 is a diagram showing the relative timing of the signals of FIG. 2 according to an embodiment of the invention.

Referring to FIGS. 2 and 3, the operation of the read circuit 40 according to one embodiment of the invention is as follows. At an initial time t0, Data Clock, Reference Clock, WLS, and Enable are inactive low. Therefore, the data and reference switches 60 and 62 are inactive, the comparison circuit 54 is non-operational, and the memory cell 42 is inactive. Even though the memory cell 42 is inactive, it or other memory cells 42 (not shown in FIG. 2 for clarity) may generate an offset current, which generates an offset voltage drop, $V_{OFF}$, across the load 44 and a pre-read voltage (pre-read voltage=$V_{DD}$–$V_{OFF}$) on the node 48. But as described below, such an offset current will not affect the accuracy of the data read by the circuit 40.

At time t1, Data Clock and Reference Clock go active high to activate the switches 60 and 62, respectively. The signal WL is still inactive, and thus the switches 60 and 62 couple the pre-read voltage on the node 48 to both of the input terminals 56 and 58 of the comparison circuit 54. Reference Clock activates the switch 62 long enough for the parasitic capacitor 66 to charge to a reference voltage $V_R$, which equals the pre-read voltage in this embodiment. Because the pre-read voltage is coupled to both of the input terminals 56 and 58, it is a common mode signal that is rejected by the comparison circuit 54. Thus, the comparison circuit 54 effectively ignores the voltage change (–$V_{OFF}$) at the node 48 caused by the offset current flowing in the bit line 46.

Still referring to FIGS. 2 and 3, at time t2, Reference Clock goes inactive low, thus deactivating the switch 62. Because the impedance at the input terminal 58 is high, the capacitor 66 holds the terminal 58 at $V_R$.

At time t3, WLS goes active high to activate the memory cell 42. A read current then flows in the bit line 46, the value of the read current depending on the programming state of the cell 42. For example, if the cell 42 is erased, then a nonzero current flows in the bit line 46 to generate a read voltage at the node 48 that is lower than the pre-read voltage. Conversely, if the memory cell 42 is programmed, then a zero read current flows in the bit line 46 to generate a read voltage at the node 48 that is the same as the pre-read voltage. Because Data Clock is still activating the switch 60, the parasitic capacitor 64 charges to a voltage $V_D$, which equals the read voltage at the node 48 in this embodiment.

At time t4, Data Clock goes inactive low and thus deactivates the switch 60. Because of the high impedance at the terminal 56, the parasitic capacitor 64 holds $V_D$ at the terminal 56. At time t5, WLS goes inactive low to deactivate the memory cell 42.

At time t6, Enable goes active high to enable the comparison circuit 54. Because the inputs terminals 56 and 58 are unbalanced in favor of the terminal 56, if the memory cell 42 is programmed and thus $V_D$ and $V_R$ are equal, the comparison circuit 54 in effect interprets $V_D$ as being higher than $V_R$. Thus, the circuit 54 drives Data Out high to indicate that the cell 42 is storing a programmed logic state, here a logic 1. Conversely, if the cell 42 is erased and thus $V_R$ is higher than $V_D$, then the comparison circuit 54 drives Data Out low to indicate that the cell 42 is storing an erased logic state, here a logic 0.

Although the read circuit 40 is described in conjunction with the timing diagram of FIG. 3, in other embodiments the circuit 40 and signal timing can be altered to give a similar result. For example, the control circuit 52 may activate the memory cell 42 and the data switch 60 before activating the reference switch 62 such that the capacitor 64 stores the read voltage before the capacitor 66 stores the pre-read voltage. Or, where the circuit 54 is a static sense amplifier, the data switch 60 may be removed and the input terminal 56 directly connected to the node 48. In such an embodiment, the reference switch 62 is activated so that the capacitor 66 stores the pre-read voltage, and then the reference switch 62 is deactivated and the cell 42 activated so that the comparison circuit 54 compares the read voltage at the node 48 with stored pre-read voltage. Alternatively, the reference switch 62 may be removed and the input terminal 58 directly connected to the node 48. In this embodiment, the cell 42 and data switch 60 are activated so that the capacitor 64 stores the read voltage, and then the cell 42 and data switch 60 are deactivated so that the comparison circuit 54 compares the pre-read voltage at the node 48 with the stored read voltage. Furthermore, although shown as becoming active after both WLS and Data Clock become inactive, Enable can become active while WLS is active. If a static sense amplifier is used for the comparison circuit 54, then Enable can even become active while Data Clock is active.

FIGS. 4A–4B and 5A–5B are schematic diagrams of different embodiments of unbalanced sense amplifiers that can be used for the comparison circuit 54 of FIG. 2.

Figure 4A:
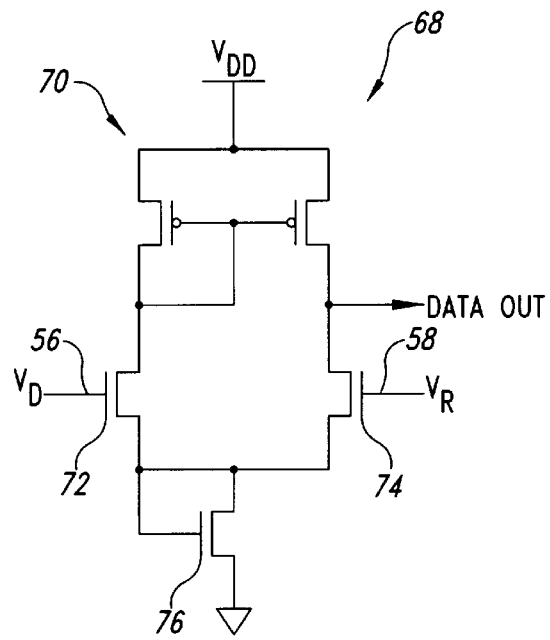
FIG. 4A is a schematic diagram of an embodiment of an unbalanced static sense amplifier that can be used in the read circuit of FIG. 2.

Referring to FIG. 4A, an embodiment of an unbalanced static sense amplifier 68 includes a current mirror 70, input transistors 72 and 74, which are respectively coupled to the input terminals 56 and 58, and a current source 76. The width-to-length ratios of the input transistors 72 and 74 are such that the transistor 72 has a higher gain than the transistor 74. For example, if the channel lengths of the transistors 72 and 74 are equal, then the channel width of the transistor 72 is greater than the channel width of the transistor 74. Likewise, if the channel widths of the transistors 72 and 74 are equal, then the channel length of the transistor 74 is greater than the channel length of the transistor 72.

In operation, when $V_D$ equals $V_R$ such as occurs when the memory cell 42 of FIG. 2 is programmed, then the higher-gain transistor 72 draws more current than the transistor 74, thus driving Data Out high. But the gains of the transistors 72 and 74 are such that when the memory cell 42 is erased, $V_D$, which is lower than $V_R$, is low enough so that the transistor 74 draws more current than the transistor 72, thus driving Data Out low.

Figure 4B:
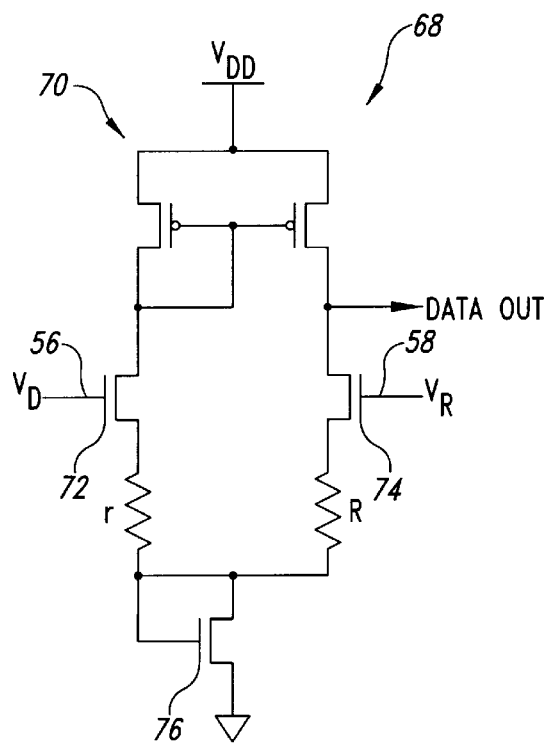
FIG. 4B is a schematic diagram of another embodiment of an unbalanced static sense amplifier that can be used in the read circuit of FIG. 2.

FIG. 4B is a schematic diagram of another embodiment of the unbalanced static sense amplifier 68. The sense amplifier 68 of FIG. 4B is similar to that of FIG. 4A, except that the transistors 72 and 74 have equal gains and the gains of the sensing branches are set to different values with resistors r and R. Specifically, R is greater than r such that when the memory cell 42 (FIG. 2) is programmed and thus $V_D$ and $V_R$ are equal, the branch including r draws more current than the branch including R, and thus drives Data Out high. Furthermore, the ratio R/r is such that when the memory cell 42 is erased, $V_D$, which is lower than $V_R$, is low enough so that the branch including R draws more current than the branch including r, and thus drives Data Out low.

Furthermore, the unbalanced static sense amplifiers 68 of FIGS. 4A and 4B can be enabled/disabled by including a switch (not shown) between the power supply $V_{DD}$ and the current mirror 70. Alternatively, the current source 76 or a switch (not shown) coupled in series therewith can be used to enable/disable the amplifiers 68.

Figure 5A:
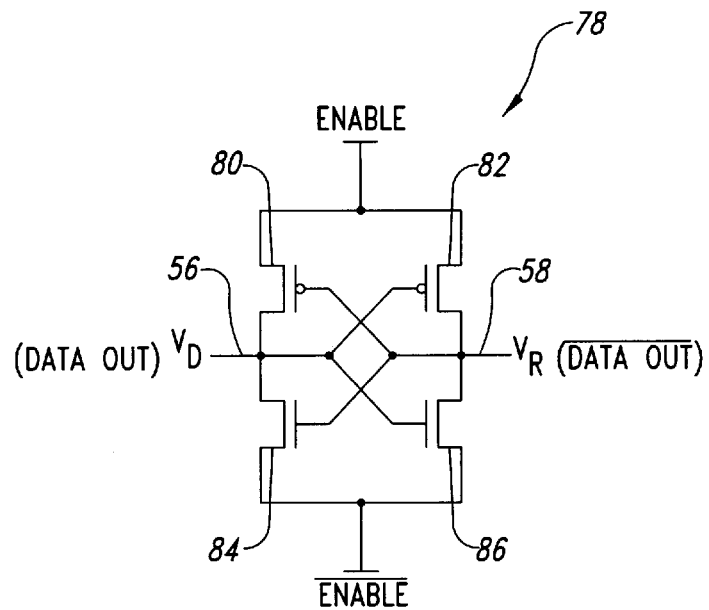
FIG. 5A is a schematic diagram of an embodiment of an unbalanced dynamic sense amplifier that can be used in the read circuit of FIG. 2.

FIG. 5A is a schematic diagram of an embodiment of an unbalanced dynamic sense amplifier 78. A major difference between a dynamic sense amplifier and a static sense amplifier is that in a dynamic sense amplifier, the terminals 56 and 58 act as both input and output terminals and the amplifier is not enabled (Enable=logic 1 and $\overline{Enable}$=logic 0) until the voltages $V_D$ and $V_R$ have reached or are close to their steady-state values. The sense amplifier 78 includes PMOS pull-up transistors 80 and 82 and NMOS pull-down transistors 84 and 86. The gain of the transistor 86 is greater than that of the transistor 84. Thus, when the memory cell 42 (FIG. 2) is programmed such that $V_D$ equals $V_R$, the activated sense amplifier 78 drives $\overline{Data\ Out}$ (terminal 58 used as an output terminal) low and Data Out (terminal 56 used as an output terminal) high. Furthermore, the gains of the transistors 84 and 86 are such that when the memory cell 42 is erased, and thus $V_D$ is less than $V_R$, the activated sense amplifier 78 drives $\overline{Data\ Out}$ high and Data Out low.

Figure 5B:
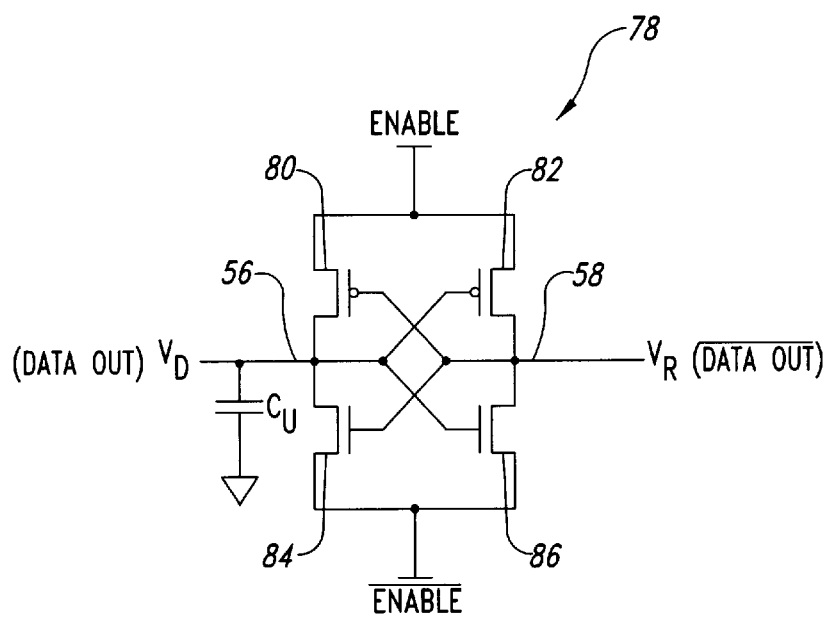
FIG. 5B is a schematic diagram of another embodiment of an unbalanced dynamic sense amplifier that can be used in the read circuit of FIG. 2.

FIG. 5B is a schematic diagram of another embodiment of the unbalanced dynamic sense amplifier 78. This embodiment is similar to that of FIG. 5A except that the transistors 84 and 86 have the same gain, and a capacitance, which is represented schematically by a capacitor $C_U$, is added to the parasitic capacitor 64 (FIG. 2) to unbalance the amplifier 78. Thus, referring to FIG. 2, when the cell 42 is programmed, $V_D$ equals $V_R$ and the activated amplifier 78 drives Data Out high and $\overline{Data\ Out}$ low. Conversely, when the cell 42 is erased, $V_D$ is lower than $V_R$ and the value of $C_U$ is such that the activated amplifier 78 drives Data Out low and $\overline{Data\ Out}$ high.

Figure 6:
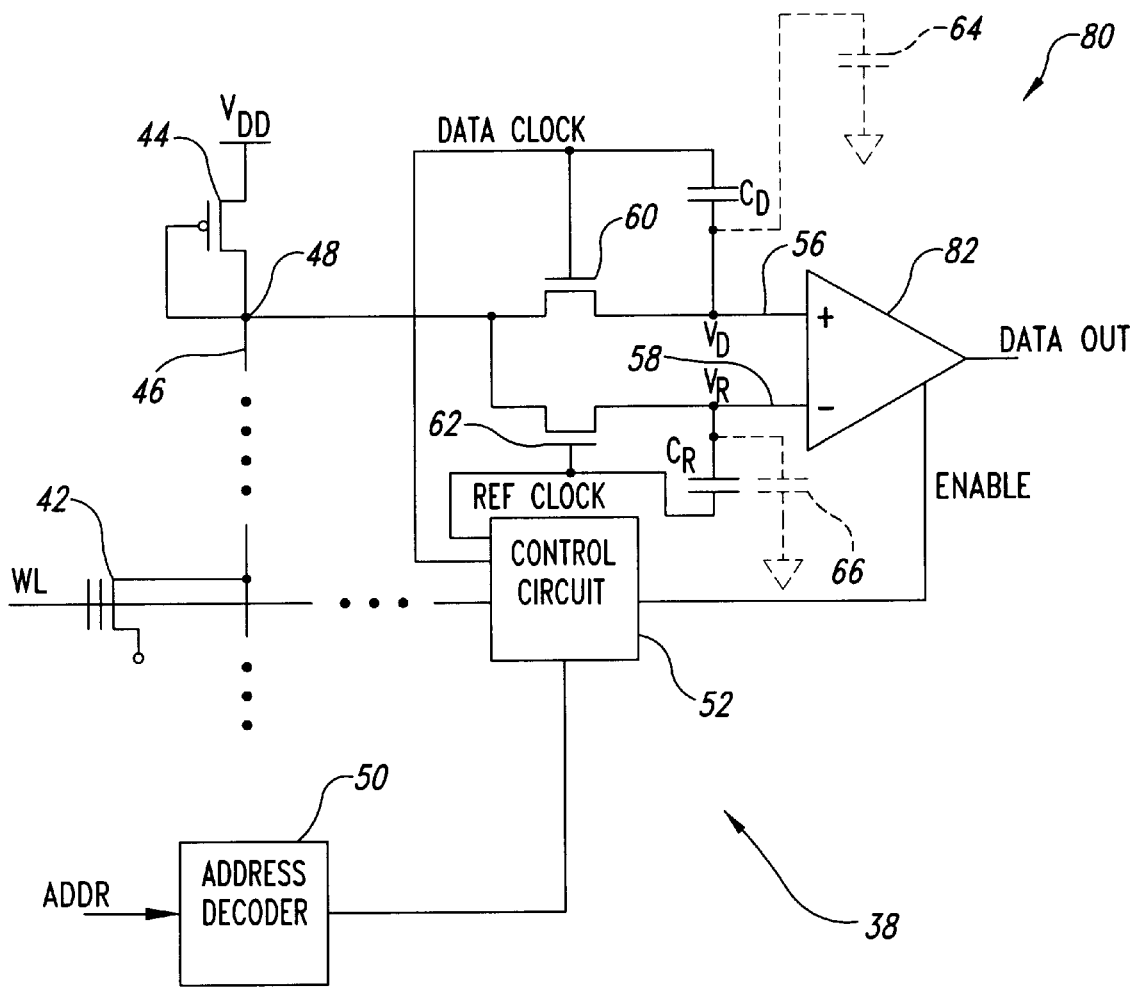
FIG. 6 is a schematic diagram of a memory circuit that includes another embodiment of a memory-cell read circuit according to the invention.

FIG. 6 is a schematic diagram of the memory circuit 38, which includes a read circuit 80 according to another embodiment of the invention. The read circuit 80 is similar to the read circuit 40 of FIG. 2 except that it includes a balanced comparison circuit 82 instead of the unbalanced comparison circuit 54 of FIG. 2. A balanced comparison circuit is often more stable, easier to design and manufacture, and smaller than an unbalanced comparison circuit. Furthermore, the reference switch 62 is constructed so that the value of its inherent gate/source capacitance, which is represented schematically by the capacitor $C_R$, causes $V_R$ to be between the programmed and erased read voltages on the node 48.

In operation in one embodiment, the read circuit 80 uses the signal timing of FIG. 3. Specifically, between times t1 and t2, Reference Clock is high and the reference switch 62 is active to allow the capacitors 66 and $C_R$ to charge such that the pre-read voltage $V_{DD}-V_{OFF}$ at the node 48 is also at the terminal 58. The capacitor 66, which is coupled between the terminal 58 and ground, charges to the pre-read voltage. The capacitor $C_R$, however, is coupled between the gate voltage, which in this embodiment is $V_{DD}$, and the terminal 58. Therefore, the capacitor $C_R$ charges to a voltage equal to the voltage drop across the load 44, i.e., the offset voltage $V_{OFF}$.

At time t2, Reference Clock goes low and deactivates the switch 62. The capacitor $C_R$ is now coupled between the gate voltage, which is now ground in this embodiment, and the terminal 58, and is thus in parallel with the capacitor 66. Therefore, the change in the voltage at the node 58 is $$-\left(\frac{C_R}{C_R+C_{66}}\right)V_{DD}, \text{ and } V_R = (V_{DD}-V_{OFF})-\left(\frac{C_R}{C_R+C_{66}}\right)V_{DD}.$$

In one embodiment, it is desired that $V_R$ be halfway between the read voltage at the node 48 when the cell 42 is programmed and the read voltage at the node 48 when the cell 42 is erased. For example purposes, assume that $V_{DD}$=5V, $V_{OFF}$=0.1V, and the expected difference between the programmed and erased read voltages at the node 48 is 0.2V. Therefore, the programmed read voltage=4.9V, the erased read voltage=4.7V, and the desired value of $V_R$=4.8V. Solving the above equation, $C_{66}/C_R$=49. Therefore, for example, if $C_{66}$=0.25 picofarads (pf), then the transistor 62 is designed such that $C_R \approx 5$ fempto farads (ff).

Still referring to FIG. 6, the value of the capacitor $C_D$, which is the inherent gate/source capacitance of the data-switch transistor 60, is not critical, except that it should be relatively small so that after the switch 60 is deactivated, $V_D$ is shifted as little as possible from the read voltage on the node 48. Thus, in operation using the above calculated values, when the cell 42 is programmed, $V_D$ is approximately equal to 4.9V, which is greater than $V_R$=4.8V. This causes the comparison circuit 82 to drive Data Out high. Conversely, when the cell 42 is erased, $V_D$ is approximately equal to 4.7V, which is lower than $V_R$=4.8V. This causes the sense comparison circuit 82 to drive Data Out low.

Although the read circuit 80 is described in conjunction with the timing diagram of FIG. 3, in other embodiments the circuit 80 and the signal timing can be altered to give a similar result. For example, the control circuit 52 may activate the memory cell 42 and the data switch 60 before activating the reference switch 62 such that the capacitors $C_D$ and 64 are charged before the capacitors $C_R$ and 66. Or, where the comparison circuit 82 is a static sense amplifier, the data switch 60 may be removed and the terminal 56 directly connected to the node 48. In such an embodiment, the reference switch 62 is activated so that the capacitors $C_R$ and 66 charge to the appropriate voltages, and then the switch 62 is deactivated and the cell 42 is activated so that the comparison circuit 82 compares the read voltage at the node 48 with stored $V_R$. Furthermore, although shown as becoming active after both WLS and Data Clock become inactive, Enable can become active while WLS is active. If a static sense amplifier is used for the comparison circuit 82, then Enable can even become active while Data Clock is active.

Figure 7:
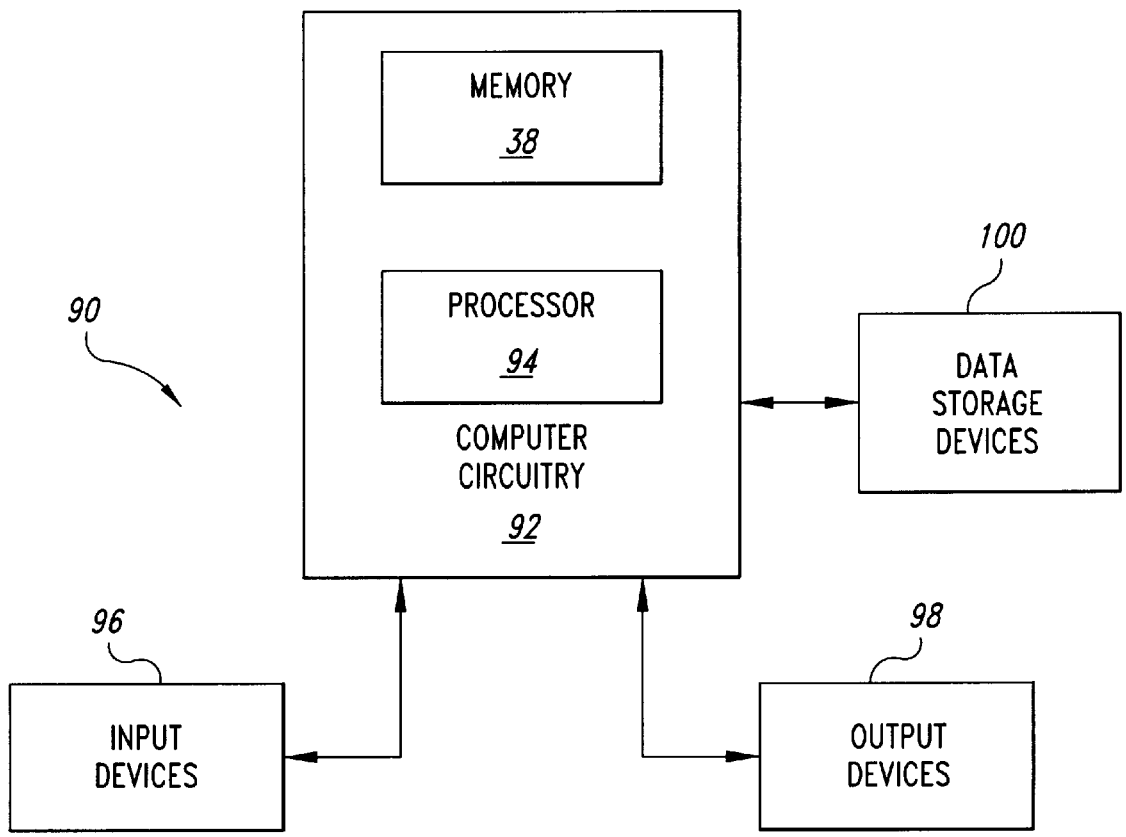
FIG. 7 is a schematic block diagram of an electronic system that incorporates the memory circuit of FIG. 2 or the memory circuit of FIG. 6.

FIG. 7 is a schematic block diagram of an electronic system 90, such as a computer system, that incorporates the memory circuit 38 of FIG. 2 or FIG. 6. The system 90 includes computer circuitry 92 for performing computer functions, such as executing software to perform desired calculations and tasks. The circuitry 92 typically includes a processor 94 and the memory circuit 38, which is coupled to the processor 94. In one embodiment, the computer circuitry 92 includes address, data, and command busses and a clock line that are respectively coupled to the memory device 38 and the processor 94. One or more input devices 96, such as a keyboard or a mouse, are coupled to the computer circuitry 92 and allow an operator (not shown) to manually input data thereto. One or more output devices 98 are coupled to the computer circuitry 92 to provide to the operator data generated by the computer circuitry 92. Examples of such output devices 98 include a printer and a video display unit. One or more data-storage devices 100 are coupled to the computer circuitry 92 to store data on or retrieve data from external storage media (not shown). Examples of the storage devices 100 and the corresponding storage media include drives that accept hard and floppy disks, tape cassettes, and compact disk read-only memories (CD-ROMs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A read circuit for reading data stored in a memory cell that is coupled to a bit line, the circuit comprising:
    a comparison circuit having a first input terminal coupled to the bit line and having a second input terminal and a data output terminal, the first and second terminals having first and second capacitors, respectively, coupled thereto; and
    a switch coupled between the bit line and the second input terminal of the comparison circuit and having a control terminal coupled to receive a control signal, the switch comprising a reference transistor having a source terminal coupled to the second input terminal of the comparison circuit and having a gate terminal coupled to the control terminal, the reference transistor having a third capacitor coupled between the gate terminal and the source terminal thereof, the capacitance of the third capacitor being such that the second and third capacitors generate a reference signal when the reference switch is inactive.

2. The read circuit of claim 1, further comprising:
    a data switch coupled between the bit line and the first input terminal of the comparison circuit and having a data control terminal coupled to receive a data control signal.

3. The read circuit of claim 1 wherein the comparison circuit comprises a control terminal coupled to receive an enable signal.

4. The read circuit of claim 1 wherein the comparison circuit is unbalanced.

5. The read circuit of claim 1 wherein the comparison circuit is balanced.

6. The read circuit of claim 1 wherein the first and second capacitors comprise parasitic capacitors.

7. A read circuit for reading data stored in a memory cell that is coupled to a bit line, the circuit comprising:
    a comparison circuit having a first input terminal coupled to the bit line, having a second input terminal, the first and second terminals having first and second capacitors, respectively, coupled thereto, and operable to generate an output signal that represents the stored data;
    a switch coupled to the bit line and to the second input terminal of the comparison circuit, the switch comprising a reference transistor having a source terminal coupled to the second input terminal of the comparison circuit and having a gate terminal coupled to the control circuit, the reference transistor having a third capacitor coupled between the gate terminal and the source terminal thereof, the capacitance of the third capacitor being such that the second and third capacitors generate a reference signal when the reference switch is inactive; and
    a control circuit coupled to the switch and operable to activate and then deactivate the switch.

8. The read circuit of claim 7, further comprising:
    a data switch coupled between the bit line and the first input terminal of the comparison circuit and coupled to the control circuit; and
    wherein the control circuit is operable to activate and then deactivate the reference switch while the memory cell is inactive and is operable to activate the data switch while the memory cell is active.

9. A memory circuit, comprising:
    a bit line;
    a memory cell that is coupled to the bit line;
    a comparison circuit having a first terminal coupled to the bit line and having a second input terminal and a data output terminal, the first and second terminals having first and second capacitors, respectively, coupled thereto;
    a switch coupled between the bit line and the second input terminal of the comparison circuit and having a control terminal coupled to receive a control signal, the switch comprising a reference transistor having a source terminal coupled to the second input terminal of the comparison circuit and having a gate terminal coupled to the control terminal, the reference transistor having a third capacitor coupled between the gate terminal and the source terminal thereof, the capacitance of the third capacitor being such that the second and third capacitors generate a reference signal when the reference switch is inactive;
    a supply terminal; and
    a load coupled between the supply terminal and the bit line.

10. The memory circuit of claim 9 wherein the memory cell comprises a nonvolatile memory cell.

11. An electronic system, comprising:
    a data input device;
    a data output device; and
    computing circuitry coupled to the data input device and the data output device and including a memory circuit that includes,
        a bit line,
        a memory cell that is coupled to the bit line,
        a comparison circuit having a first terminal coupled to the bit line and having a second input terminal and a data output terminal, the first and second terminals having first and second capacitors, respectively, coupled thereto, and
        a switch coupled between the bit line and the second input terminal of the comparison circuit and having a control terminal coupled to receive a control signal, the switch comprising a reference transistor having a source terminal coupled to the second input terminal of the comparison circuit and having a gate terminal coupled to the control terminal, the reference transistor having a third capacitor coupled between the gate terminal and the source terminal thereof, the capacitance of the third capacitor being such that the second and third capacitors generate a reference signal when the reference switch is inactive.

12. A method for reading data stored in a memory cell coupled to a bit line, the method comprising:
    coupling the bit line to and then uncoupling the bit line from a reference terminal of a comparison circuit while the memory cell is inactive to charge a first capacitor to a pre-read voltage and a second capacitor to an offset voltage;

coupling the bit line to a data terminal of the comparison circuit while the memory cell is active to charge a third capacitor to a read voltage; and generating a read signal with the comparison circuit after the uncoupling of the bit line from the reference terminal and the coupling of the bit line to the data terminal.

13. The method of claim 12 wherein the generating comprises activating the comparison circuit after uncoupling the bit line from the reference terminal and coupling the bit line to the data terminal.

14. The method of claim 12, further comprising:

uncoupling the bit line from the data terminal after coupling the bit line to the data terminal and while the memory cell is active; and activating the comparison circuit after the uncoupling the bit line from both the reference and data terminals.

15. A method for reading data stored in a memory cell coupled to a bit line, the method comprising:

when the memory cell is inactive, coupling a first terminal of a first reference capacitor to a first voltage, coupling a first node to the bit line, the first node being coupled to a second terminal of the first reference capacitor and to a first terminal of a second reference capacitor, and coupling a second terminal of the second reference capacitor to a second voltage, and then uncoupling the bit line from the first node and coupling the first terminal of the first reference capacitor to the second voltage;

when the memory cell is active, coupling the bit line to a second node by coupling the bit line to a first terminal of a third capacitor having a second terminal coupled to the second voltage; and after uncoupling the bit line from the first node and coupling the bit line to the second node, comparing a voltage on the first node with a voltage on the second node to generate a data signal that represents the stored data, and, when the memory cell is active, uncoupling the bit line from the first terminal of the third capacitor.

* * * * *